United States Patent
Hill

(10) Patent No.: US 6,317,009 B2
(45) Date of Patent: *Nov. 13, 2001

(54) FREQUENCY SHIFT KEY MODULATING OSCILLATOR

(75) Inventor: John P. Hill, Westland, MI (US)

(73) Assignee: Lear Automotive Dearborn, Inc., Southfield, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/836,047

(22) Filed: Apr. 16, 2001

Related U.S. Application Data

(63) Continuation of application No. 08/566,270, filed on Dec. 1, 1995, now Pat. No. 6,225,873.

(51) Int. Cl.$^7$ .............................. H03C 3/00; H04L 27/12
(52) U.S. Cl. ..................... 332/102; 331/107 A; 331/179; 332/100; 332/101; 375/272; 375/303; 375/304; 375/306; 375/307
(58) Field of Search ..................................... 332/100, 101, 332/102; 331/107 A, 179; 375/272, 303, 304, 306, 307

(56) References Cited

U.S. PATENT DOCUMENTS

| | | | | |
|---|---|---|---|---|
| 3,451,012 | * | 6/1969 | Spiro | 332/102 |
| 5,138,284 | * | 8/1992 | Yabuki et al. | 331/56 |
| 5,367,537 | * | 11/1994 | Anderson | 375/306 |
| 5,532,654 | * | 7/1996 | Ieki et al. | 332/102 |

* cited by examiner

Primary Examiner—Siegfried H. Grimm
(74) Attorney, Agent, or Firm—Brooks & Kushman P.C.

(57) ABSTRACT

The present invention teaches a system for selectably oscillating at a first or a second oscillating frequency. The system comprises an oscillator for providing an oscillating output. Moreover, the system comprises a switching device for selecting a first or a second impedance in response to a select signal having a voltage. Each of the first and second impedances are fixed independently of the select signal voltage such that the oscillating output oscillates at the first oscillating frequency when the first impedance is provided and oscillates at the second oscillating frequency when the second impedance is provided.

15 Claims, 6 Drawing Sheets

FREQUENCY SHIFT KEY MODULATING OSCILLATOR

CROSS-REFERENCE TO RELATED APPLICATIONS

This application is a continuation of U.S. application Ser. No. 08/566,270, filed Dec. 1, 1995, now U.S. Pat. No. 6,225,873.

FIELD OF THE INVENTION

This invention relates generally to remote transmitters and, more particularly, to a frequency modulated balanced oscillator.

BACKGROUND OF THE INVENTION

Compact radio frequency ("RF") transmitters are widely employed in connection with remote signal communication systems, primarily for remotely controlling automatic garage door systems, electronic sound systems, televisions and VCRs. In the automotive industry, compact RF transmitters are commonly used in remote keyless entry systems to provide remote control access to a vehicle, as well as for enabling other vehicular functions including alarm system features and a trunk release, for example. Ideally, hand held transmitters are battery operated, energy efficient and intended to accommodate a compact enclosure.

In one known compact remote system design, an RF transmitter radiates an RF signal with a predetermined carrier frequency encoded according to an on/off switched pattern. This radiating signal is subsequently received by a remote receiver. Once received, the signal is processed, if necessary, and then provided as a control signal to control a function or feature of the system.

Currently, a number of compact remote RF transmitters employ a single oscillator design for providing a local oscillation signal. As illustrated in FIG. 1, a conventional transmitter circuit 5 is shown with a single oscillating circuit commonly referred to as the Colpitts oscillator. Transmitter circuit 5 generates a local oscillation signal which is transmitted from an antenna element $L_1$. In light of its simplicity, circuit 5 has been the transmitter component of choice in automotive, remote controlled, keyless entry systems.

Referring to FIG. 1 in greater detail, the Colpitts oscillator of circuit 5 comprises a Colpitts configured transistor $Q_1$, and an input resonant tank circuit. The tank circuit typically comprises a resonator, such as a surface acoustic wave ("SAW") device 2, and a pair of feedback capacitors, $C_1$ and $C_2$. Further, the oscillator also includes a number of biasing resistors to facilitate the proper operation of transistor $Q_1$. Transmitter circuit 5 also comprises an inductor $L_1$ which acts as an antenna element for radiating the RF output signal.

Structurally, transistor $Q_1$, comprises a base 4, collector 6 and emitter 8. Base terminal 4 is coupled with surface acoustic wave resonator 2, and collector 6 is coupled with inductor $L_1$, while emitter 8 is coupled to ground through a resistor $R_3$. Additionally, feedback capacitor $C_2$ is coupled between emitter 8 and ground, and as such, is in parallel with resistor $R_3$. Feedback capacitor $C_1$, is coupled between collector 6 and emitter 8. Moreover, a third capacitor $C_3$ is coupled between inductor $L_1$ and ground for providing a large capacitance to maintain a constant DC voltage.

Circuit 5, and more particularly $L_1$ and $C_3$, is coupled to a direct current ("DC") voltage source to receive a DC bias input $V_{IN}$, typically 6V. Transmitter circuit 5 also receives a data input signal $V_{DATA}$ for encoding the RF carrier signal.

As detailed hereinabove, circuit 5 generates a radiating output signal via inductor $L_1$. In doing so, transistor $Q_1$, acting as an amplifier, in combination with the resonating tank circuit, generates a resonating signal which is provided to inductor $L_1$ as an oscillating current signal I. The conduction of current I through inductor $L_1$ in turn causes the radiating output signal to be transmitted as an electromagnetic field.

The above described Colpitts oscillator is well suited for the RF signal transmission applications of a remote keyless entry system. However, such an oscillator design provides a limited amount of power output. Further, the alternative of a greater inductance value for radiating inductor $L_1$ may not feasibly achieve a corresponding increase in power due to the inherent limitations of such components. Similar attempts to enhance output power through the optimization of component values has proved futile in view of the matching losses created thereby. Moreover, rail-to-rail voltage swings in transistor $Q_1$ tend to confine the amount of current flow through the circuit which, in turn, diminishes the available power output realized by a given transmitter circuit.

As a result of the limited power available from compact remote transmitters using Colpitts oscillators, another problem has arisen with their application in compact remote transmitters. Typically, compact remote transmitters are hand grasped and directed generally toward a receiver of the system. By so doing, a parasitic impedance is created by the user's hand. This additional impedance reduces the amount of transmitted energy towards the receiver. This becomes an issue of particular significance in view of the limited power available from a traditional Colpitts oscillator.

Moreover, present compact remote transmitters employ a frequency shift key ("FSK") modulation scheme. Realizations of these designs have incorporated expensive components such as a PIN or varactor diode. One such FSK oscillator is depicted in U.S. Pat. No. 5,367,537. In these circuits, the PIN or varactor diode changes capacitance in response to a change in the control voltage applied. Unfortunately, this control voltage changes with the life of the battery supply voltage. As such, the center frequency of the FSK oscillator in turn drifts. This frequency drifting phenomenon is highly undesirable to the long term efficacy of a compact remote transmitter design.

In view of these problems, a need remains for a frequency shift key modulating oscillator circuit having a predictable center frequency which is not prone to drifting. A demand further exists for a frequency shift key modulating oscillator circuit which is more cost effective. Moreover, industry requires a frequency shift key modulating oscillator circuit drawing less energy from the power supply, and as such having an extended life span.

SUMMARY OF THE INVENTION

The primary advantage of the present invention is to overcome the limitations of the known art.

Another advantage of the present invention is to provide for a frequency shift key modulating oscillator circuit having a predictable center frequency which is not prone to frequency drifting.

A further advantage of the present invention is to provide for a frequency shift key modulating oscillator circuit which is more cost effective.

Still another advantage of the present invention is to provide for a frequency shift key modulating oscillator circuit drawing less energy from the power supply, and as such having an extended life span.

In order to achieve the advantages of the present invention, a system for delectably oscillating at a first or a second oscillating frequency is disclosed. The system comprises an oscillator for providing an oscillating output. Moreover, the system comprises a switching device for selecting a first or a second impedance in response to a select signal having a voltage. Each of the first and second impedances are fixed independently of the select signal voltage such that the oscillating output oscillates at the first oscillating frequency when the first impedance is provided and oscillates at the second oscillating frequency when the second impedance is provided.

These and other advantages and objects will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the present disclosure are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 1:
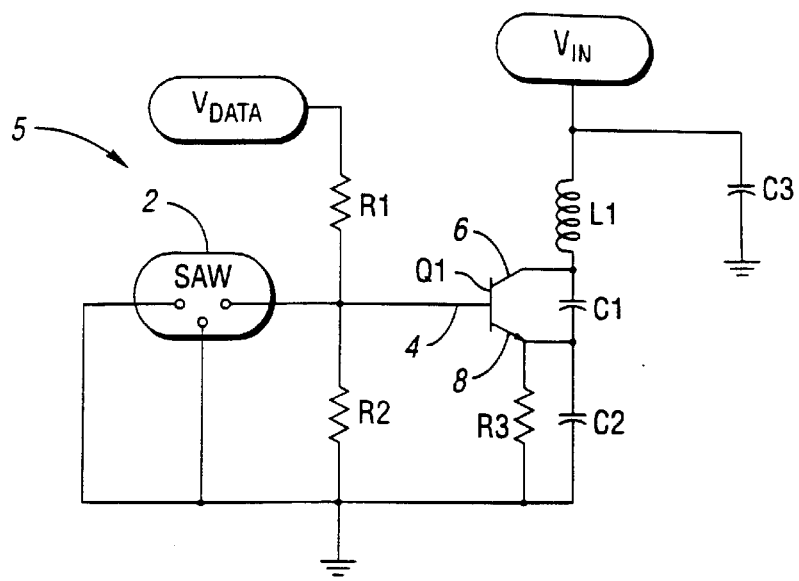
FIG. 1 illustrates a circuit diagram illustrating a conventional single Colpitts-type oscillator and transmitter circuit.
Figure 2:
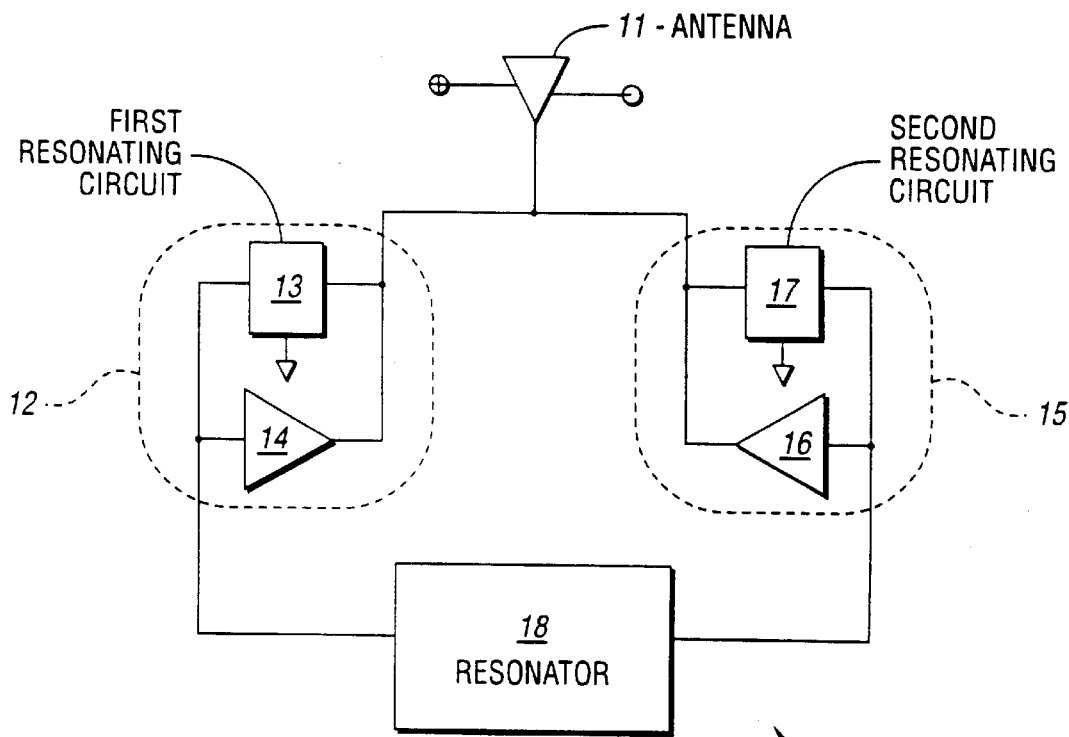
FIG. 2 illustrates a block diagram of a balanced oscillator and transmitter system.

Referring to FIG. 2, a balanced oscillator and transmitter system 10 is illustrated according to a first embodiment of the present invention. System 10 comprises a resonator 18 for generating a reference signal having a resonating frequency. Resonator 18 preferably comprises a surface acoustic wave ("SAW") device, and the resonating frequency preferably falls within the radio frequency ("RF") spectrum. It should be obvious to one of ordinary skill in the art, however, that other components, such as a bulk acoustic wave ("BAW") device for example, may also be employed to realize the functional purpose of the resonator.

System 10 additionally comprises a first and second oscillator, 12 and 15, each for generating an oscillating output in response to the resonating frequency of the resonator 18. First oscillator 12 comprises an amplifier 14 for amplifying an input corresponding with the reference signal provided by resonator 18, and a resonating circuit 13, coupled with amplifier 14, for generating an oscillating signal in response to output of amplifier 14. Similarly, second oscillator 15 comprises an amplifier 16 for amplifying an input corresponding with the reference signal provided by resonator 18, and a resonating circuit 17, coupled with amplifier 16, for generating an oscillating signal in response to output of amplifier 16. While both oscillators preferably comprise identical functional components, it should be apparent to one of ordinary skill in the art that alternate oscillator designs may be realized while still achieving the advantages of the present invention. To provide a balanced design, the outputs of both oscillators 12 and 15 are 180 degrees out of phase with one another, yet equal in magnitude.

System 10 moreover comprises an antenna 11 for radiating an output signal having a single frequency. The output signal of antenna 11 corresponds with the sum of both first and second oscillating outputs. The relationship between the output signal and the first and second oscillating signals can be best understood by appreciating the output characteristics of system 10. Comprising an output impedance, system 10 can be viewed using a voltage divider model. Using this illustration, both first and second oscillator outputs are representative of an input to the divider. The model further comprises a first impedance associated with the impedance seen by each oscillator to ground, as well as a second impedance in series with the first impedance. Second impedance is a model of the output impedance of system 10. By way of this voltage divider model, the output signal generated by antenna 11 is representative of the voltage falling across the first impedance. Thus, in view of its balanced characteristics, the output signal transmitted by antenna 11 of system 10 differs from the sum of the oscillating outputs in amplitude alone, though the current is the same. It is, nonetheless, conceivable that the output signal might be intentionally distinguishable from the sum of the oscillating outputs in frequency or phase, as well as a combination thereof, for example, as would be apparent to one of ordinary skill in the art.

Antenna 11 preferably comprises an inductor having a direct current ("DC") center point. This DC center point partitions the inductor into a first and second equivalent inductors. Furthermore, antenna 11 comprises an alternating current ("AC") balanced oscillating point which provides a location along antenna 11 where the AC voltage magnitude of the oscillating outputs of first and second oscillators 12 and 15 are both substantially zero. In view of both the AC and DC center points, a "balanced" oscillator is realized.

Tight tolerances for resonating circuits 13 and 17 are not required for the present balanced oscillator design. This benefit is achieved by way of the DC center point and the AC center point, as well as the balanced circuit itself. Moreover, as antenna 11 preferably transmits both oscillator outputs at a single primary frequency, the tolerances associated with resonating circuits 13 and 17 are less critical to the overall operation of system 10.

In a further embodiment of the present invention, antenna 11 comprises a primary winding of a center tapped transformer for transmitting the oscillating outputs of both first and second oscillators 12 and 15 onto a secondary winding. By this arrangement, secondary winding may act as antenna itself by radiating the oscillating outputs. However, this approach is preferred for low frequency operation. To support operation at other frequencies, an output inductor or the like should be employed in conjunction with a filter and matching circuit to radiate the oscillating outputs.

Figure 3:
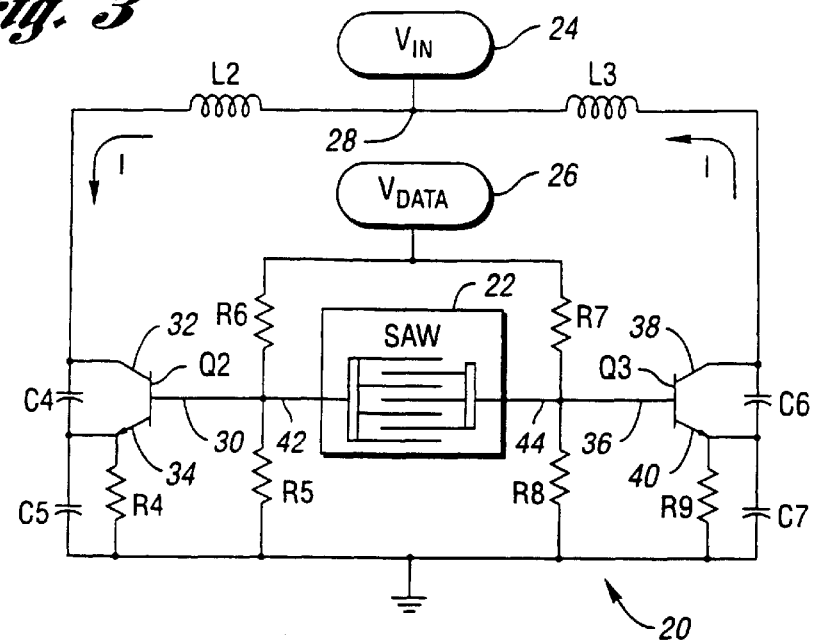
FIG. 3 illustrates a first circuit realization of the balanced oscillator and transmitter system.

Referring to FIG. 3, a circuit realization 20 is depicted of the balanced oscillator and transmitter system of FIG. 2. Balanced oscillator and transmitter circuit 20 comprises a first and second pseudo Colpitts oscillator. Both pseudo Colpitts oscillators are balanced with respect to one another and share a common tank circuit and oscillating current signal I for power output efficiency. Circuit 20 described herein is particularly applicable with automotive remote keyless entry systems. Other applications, however, are clearly conceivable to one of ordinary skill in the art.

According to a more detailed description, circuit 20 comprises a balanced oscillator configuration which includes two pseudo Colpitts oscillator circuits for producing a local oscillation signal. The oscillator circuitry includes a first transistor $Q_2$ and a second transistor $Q_3$ each coupled with a resonator device 22 therebetween. Resonator device 22 acts as a series resonant input tank for generating and stabilizing the oscillating current signal I. By so doing, a resonance RF carrier frequency is achieved.

First and second transistors, $Q_2$ and $Q_3$, each preferably comprise a bipolar junction transistor ("BJT"). Alternatives, however, such as a heterojunction bipolar transistor ("HBT"), should be apparent to one of ordinary skill in the art. According to a further embodiment, transistors $Q_2$ and $Q_3$ are each MMBTH10 type bipolar transistors.

Transistors $Q_2$ and $Q_3$ each operate as an amplification stage to provide a unity loop gain for steady state operations. First transistor $Q_2$ comprises a base, a collector, and emitter 30, 32 and 34, respectively. Likewise, second transistor $Q_3$ comprises a base, a collector, and emitter 36, 38 and 40, respectively. Transistors $Q_2$ and $Q_3$ are each configured as a pseudo Colpitts oscillator having a tuned LC circuitry and positive feedback. It should be understood by one of ordinary skill in the art that various other transistor oscillator configurations may be substituted into the above arrangement to achieve the same functional purpose.

Resonator device 22 is coupled between the base terminals 30 and 36 of transistors $Q_2$ and $Q_3$ via resonator output lines 42 and 44, respectively. Resonator 22 is shown having an array of metallic fingers formed on a piezoelectric substrate. Resonator 22 advantageously operates to stabilize oscillations of the carrier signal. Resonator device 22 preferably comprises a series resonant input tank circuit surface acoustic wave ("SAW") device. However, according to a further embodiment, SAW resonator 22 is a RO2073 SAW resonator manufactured and sold by RF Monolithics, Incorporated.

Circuit 20 further comprises a pair of output tank circuits. Each output tank circuit includes a capacitor and inductor; first input tank comprises first inductor $L_2$ and second input tank comprises second inductor $L_3$. Inductors $L_2$ and $L_3$ each operate as antenna radiating elements for radiating an output signal in response to the commonly shared oscillating current signal I. First inductor $L_2$ is coupled between collector terminal 32 of transistor $Q_2$ and node 28, while second inductor $L_3$ is coupled between collector terminal 38 of transistor $Q_3$ and node 28. Accordingly, inductors $L_2$ and $L_3$ are coupled together at node 28 in a series connection. A voltage input source 24 is coupled to node 28 between inductors $L_2$ and $L_3$ for applying a DC voltage input $V_{IN}$ thereto. According to one example of the present invention, voltage input signal $V_{IN}$ is a +3 volt DC signal. Application of the +3 volts between inductors $L_2$ and $L_3$ biases transistors $Q_2$ and $Q_3$ to realize the necessary gain. Inductors $L_2$ and $L_3$ each operate as an antenna for transmitting and radiating an electromagnetic field exhibiting the oscillating signal with the predetermined carrier frequency.

Circuit 20 further comprises a data input 26 coupled to both resonator output lines 42 and 44 though respective resistors $R_6$ and $R_7$. Data input 26 is adapted to receive an on/off data input signal $V_{DATA}$ which is applied to both sides of SAW resonator 22. Each of the resonator output lines 42 and 44 is also coupled to ground via respective resistors $R_5$ and $R_8$. The data input signal $V_{DATA}$ encodes the carrier signal with a modulation scheme to provide information on the carrier signal. The preferred modulation format is frequency shift key ("iFSK"), though other schemes including pulse width modulation ("PWM") and amplitude modulation ("AM") may be easily substituted by one of ordinary skill in the art. The information provided on the carrier signal may control and/or initiate various system operations, such as a door lock actuation mechanism, as well as the on/off operations of circuit 20. Application of data input signal $V_{DATA}$ may be initiated by manual control through an actuation mechanism such as, for example, a push-button pad, switch or other pulsed activation device.

SAW resonator 22 provides for an input tank circuit which is commonly shared by the pair of pseudo Colpitts. Inductor $L_2$, in combination with capacitors $C_4$ and $C_5$, furnishes a first output tank circuit. Similarly, inductor $L_3$, in combination with capacitors $C_6$ and $C_7$, creates a second output tank circuit. While the series resonant input tank stabilizes oscillation of the resonating signal, the output tanks provide for radiation of the RF output signal. Capacitors $C_4$ and $C_5$ also establish a voltage divider network, as well as a positive feedback path to transistor $Q_2$. Likewise, capacitors $C_6$ and $C_7$ creates a voltage divider and a positive feedback path to transistor $Q_3$. Energy is efficiently stored in the capacitors $C_4$ through $C_7$ and inductors $L_2$ and $L_3$ to enhance radiation efficacy by reducing the amount of energy that may otherwise be required for each cycle of transistors $Q_2$ and $Q_3$.

Figure 4:
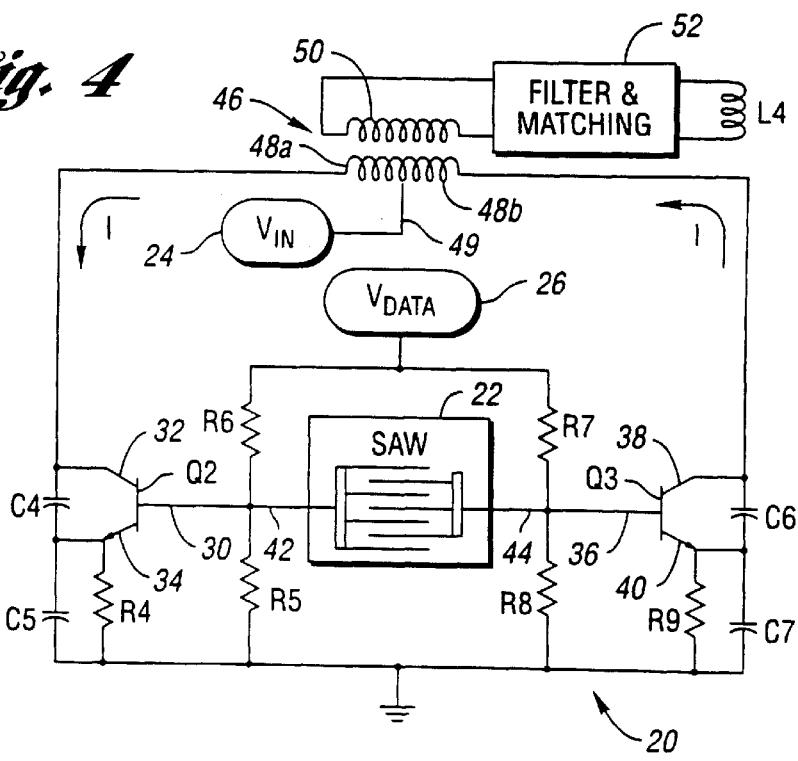
FIG. 4 illustrates a second circuit realization of the balanced oscillator and transmitter system.

Referring to FIG. 4, circuit 20 may alternately be configured to include a center-tapped transformer 46 in lieu of first and second inductors $L_2$ and $L_3$. To this end, center-tapped transformer 46 comprises a primary winding having a first primary winding portion 48a and second primary winding portion 48b. Primary winding portions 48a and 48b preferably are of substantially equal size. The voltage input source 24 is coupled to a center tap 49, located between the primary winding portions 48a and 48b, for supplying DC voltage input $V_{IN}$ thereto.

Center-tapped transformer 46 further comprises a secondary winding 50 located adjacent to the primary winding portions 48a and 48b. Transformer 46 is adapted to form a first magnetic coupling between primary winding portion 48a and the secondary winding 50, and a second magnetic coupling between primary winding portion 48b and secondary winding 50. The secondary winding 50 in turn is coupled on both ends to a filter and matching network 52. A pair of output lines extending from the filter and matching network 52 are coupled to a radiating inductor $L_4$ for radiating an output electromagnetic field therefrom.

According to the alternate embodiment of FIG. 4, the first and second primary winding portions 48a and 48b of the center-tapped transformer 46 each produce an electromagnetic field in response to the oscillating current signal I that is transmitted therethrough. The electromagnetic fields from each of primary winding portions 48*a* and 48*b* are thereby transmitted and induced onto the secondary winding 50 of the center-tapped transformer 46. The signals induced onto secondary winding 50 are summed together. The summed signal is in turn filtered to eliminate undesirable noise, and is impedance matched via filter and matching network 52. The filtered and impedance matched signal is then passed through a radiating inductor $L_4$ to transmit a single radiating output signal. Use of the center-tapped transformer 46 advantageously separates out the even harmonics and is generally better able to achieve enhanced control of the transmission of the single radiating output signal.

It should be understood that the SAW resonator 22 is a series-resonant input tank circuit which may be implemented with alternate comparable series resonant frequency stabilizing devices. As an alternative to the SAW resonator 22, the series resonant tank circuit may include a bulk acoustic wave ("BAW") device, crystal device, microstrip or any other series-resonant structure or device that may achieve the desired stabilizing signal oscillation.

Figure 5:
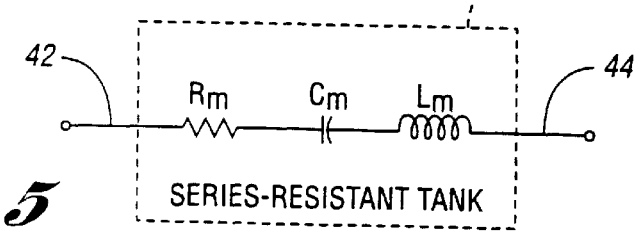
FIG. 5 illustrates a circuit realization of a series resonant tank circuit.

With particular reference to FIG. 5, a series resonant tank circuit 60 is depicted as an alternative to the SAW resonator 22 of FIGS. 2–4. Here, series resonant tank circuit 60 comprises a resistor $R_M$, capacitor $C_M$ and inductor $L_M$. Each of these components are coupled in series to create series resonant tank circuit 60. The resonant frequency of the tank circuit 60 is generally dependant on the size of the inductor $L_M$ and capacitor $C_M$.

In operation, circuit 20 receives a DC input voltage signal $V_{IN}$ through voltage input source 24. Data input $V_{DATA}$ may also be received via data input 26 to encode the carrier signal with a predetermined modulation scheme. Initially, circuit 20 forms a resonating signal which starts up and builds to a steady state energy level having oscillations at a known frequency. In doing so, transistors $Q_2$ and $Q_3$ cycle between the collector terminal 38 and emitter terminal 40 in response to noise or other induced signals and will build until the steady state is reached.

During start up, each amplification stage provides a gain in excess of unity. At steady state, the gain of each amplification stage is approximately equal to or slightly greater than unity to account for any energy loss. The series resonant tank circuit with SAW resonator 22 maintains and ensures the stability of the signal oscillation within the circuit 20. The oscillating signal in turn is exhibited by current signal I flowing through the antenna radiating elements, inductors $L_2$ and $L_3$. In addition, the feedback paths provided via capacitors $C_4$ and $C_5$ and capacitors $C_6$ and $C_7$ create a phase delay which adjusts the loop time to realize the desired frequency.

Figure 6:
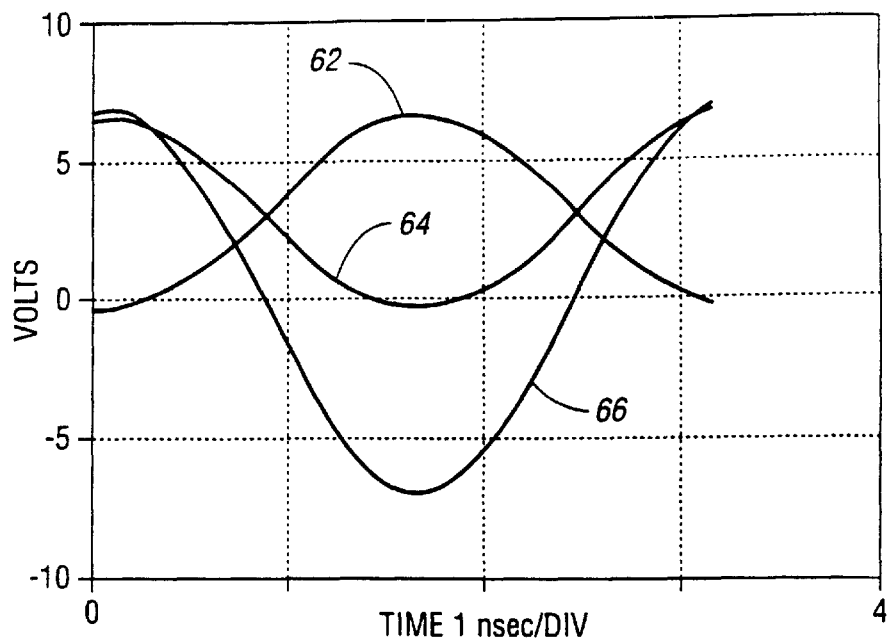
FIG. 6 illustrates a graphical representation of voltage waveforms achieved by the balanced oscillator and transmitter system of FIG. 2.

Referring to FIG. 6, a graphical representation of voltage waveforms achieved by the first embodiment of the present invention is depicted. Here, the inductors $L_2$ and $L_3$ of circuit 20 of FIG. 2 each radiate a separate signal through separate electromagnetic fields, both of which have the same carrier frequency in response to the commonly shared oscillating current signal I. These radiating output signals from inductors $L_2$ and $L_3$ and the total summed radiating output are illustrated by the waveforms 66 provided in FIG. 6. The first radiating output signal transmitted from inductor $L_2$ is shown as voltage waveform 62, while the second radiating output signal transmitted from inductor $L_3$ is depicted as voltage waveform 64. Voltage waveforms 62 and 64 are characterized as having equal-amplitudes and an approximate 180 degree phase shift relationship relative to one another. Radiating signals 62 and 64 emitted are measured with respect to voltage ground 28 and therefore exhibit the aforementioned phase shift of 180 degrees. As waveforms 62 and 64 are both measured relative to node 28, the summation of both waveforms 62 and 64 relative to the commonly shared current signal I results in a voltage waveform representing a single radiating output signal 66. Accordingly, Output signal 66 may be achieved using the pair of balanced oscillators and output tanks of the present invention.

Single radiating output signal 66 in one embodiment has a frequency of approximately 315 MHz. Additionally, the outputs from both inductor $L_2$ and inductor $L_3$ of the first and second output tanks are balanced signals which are symmetrical relative to node 28 which is preferably set at +3 volts DC. In contrast, the separate radiating signals created by center-tapped transformer 46 of one of the alternate embodiments of the present invention, may be summed and then filtered and impedance matched prior to transmission.

Figure 7:
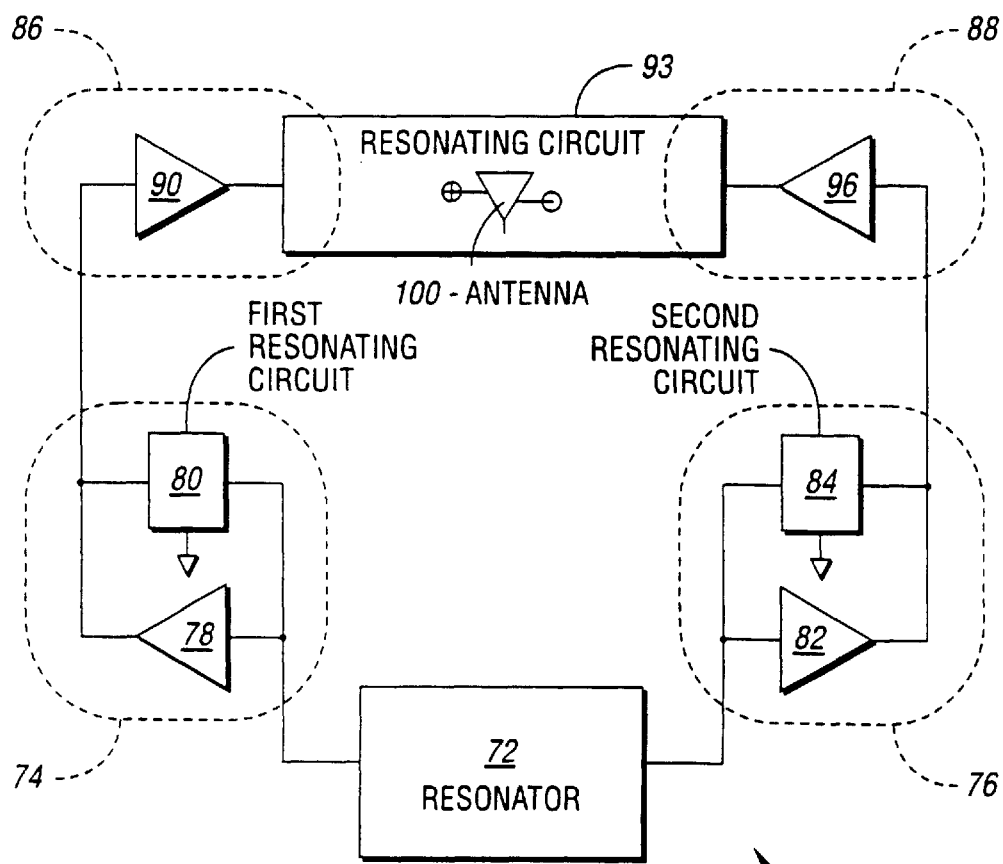
FIG. 7 illustrates a block diagram of a preferred balanced oscillator and transmitter system.

Referring to FIG. 7, a buffered balanced oscillator and transmitter system 70 is illustrated. System 70 comprises a resonator 72 for generating a reference signal having a resonating frequency. Resonator 72 preferably comprises a surface acoustic wave ("SAW") device, and the resonating frequency preferably falls within the radio frequency ("RF") spectrum. It should be obvious to one of ordinary skill in the art, however, that other components, such as a bulk acoustic wave ("BAW") device for example, may also be employed to realize the functional purpose of the resonator.

System 70 additionally comprises a first and second oscillator, 74 and 76, each for generating an oscillating output in response to the resonating frequency of the resonator 72. First oscillator 74 comprises an amplifier 78 for amplifying an input corresponding with the reference signal generated by resonator 72, and a resonating circuit 80, coupled with amplifier 78, for generating an oscillating signal in response to output of amplifier 78. Similarly, second oscillator 76 comprises an amplifier 82 for amplifying an input corresponding with the reference signal generated by resonator 72, and a resonating circuit 84, coupled with amplifier 82, for generating an oscillating signal in response to output of amplifier 82. While both oscillators preferably comprise identical functional components, it should be apparent to one of ordinary skill in the art that alternate oscillator designs may be realized while still achieving the advantages of the present invention. To provide a balanced design, the outputs of both oscillators 74 and 76 are 180 degrees out of phase with one another, yet equal in magnitude.

As a means to substantially minimize the effects of parasitic impedances, such as those created by a user's hand in holding or cupping a compact remote RF transmitter during operation, system 70 also comprises a first and second buffer, 86 and 88. First and second buffer, 86 and 88, functionally isolate resonating circuits 80 and 84, respectively, from an antenna 100. To this end, first buffer 86 comprises a buffer amplifier 90 which is coupled with a resonating circuit 93, while second buffer amplifier 88 comprises a buffer amplifier 96 also coupled with resonating circuit 93. Resonating circuit 93 comprises a series or parallel tuned resonant tank and a radiating element 100. By this arrangement, the output impedance of system 70, as viewed from the DC center point of antenna 100 along both paths created by oscillators 74 and 76, is substantially decreased, and the current is increased. This decrease in impedance and increase in current by way of current gain result in the output signal, as radiated by antenna 100, comprising a larger percentage of the first and second oscillating signals with the output signal having a larger percentage of the first and second oscillating signals, a more powerful output signal, and as such, a more powerful transmitter is realized.

Moreover, system 70 comprises antenna 100 for radiating an output signal having a single frequency. The output signal of antenna 100 corresponds with the sum of both first and second oscillating outputs. The relationship between the output signal and the first and second oscillating signals can be best understood by appreciating the output characteristics of system 70. Comprising an output impedance, system 70 can be viewed using a voltage divider model. Using this illustration, both first and second oscillator outputs are representative of an input to the divider. The model further comprises a first impedance associated with the impedance as seen by each oscillator to ground, as well as a second impedance in series with the first impedance. Second impedance is a model of the output impedance of system 70. By way of this voltage divider model, the output signal generated by antenna 100 is representative of the voltage falling across the first impedance. Thus, in view of its balanced characteristics, the output signal transmitted by antenna 100 of system 70 differs from the sum of the oscillating outputs in amplitude alone. Nonetheless, it is conceivable that the output signal might be intentionally distinguishable from the sum of the oscillating outputs in frequency or phase, as well as a combination thereof, for example, as would be apparent to one of ordinary skill in the art.

Antenna 100 preferably comprises an inductor, as part of resonant circuit 93, having a direct current ("DC") center point. This DC center point partitions the inductor into a first and second equivalent inductors. From this center point, a high impedance is created to ground through each oscillator. Furthermore, antenna 100 comprises an alternating current ("AC") balanced oscillating point which provides a location along antenna 100 where magnitude of the oscillating outputs of first and second oscillators 74 and 76 are both substantially zero. In view of both the AC and DC center points, a "balanced" oscillator is realized.

Tight tolerances for resonating circuits 80, 84 and 93 are not required for the present balanced oscillator design. This benefit is achieved by way of the DC and AC center points, as well as the balanced circuit itself. Moreover, as antenna 100 preferably transmits both oscillator outputs at a single primary frequency, the tolerances associated with resonating circuits 80, 84 and 93 are less critical to the overall operation of system 70.

In a further embodiment of the present invention, antenna 100 comprises a primary winding of a center tapped transformer for transmitting the oscillating outputs of both first and second oscillators 74 and 76 onto a secondary winding. By this arrangement, secondary winding may itself radiate the oscillating outputs. In the alternative, an output inductor or the like may be employed in conjunction with a filter and matching circuit for the purpose of radiating the oscillating outputs.

In still another embodiment of the present invention, a device is also incorporated for increasing the output range of each of the first and second oscillating output signals. Using aforementioned voltage divider model, this device further and more directly increases the output power to reduce the sensitivity of system 70 to the parasitic impedances defined above. The device preferably comprises a capacitor, though other impedances may be used, which applies a greater amount of the voltage range associated with amplifiers 78 and 82 to buffer amplifiers 90 and 96, respectively.

Figure 8:
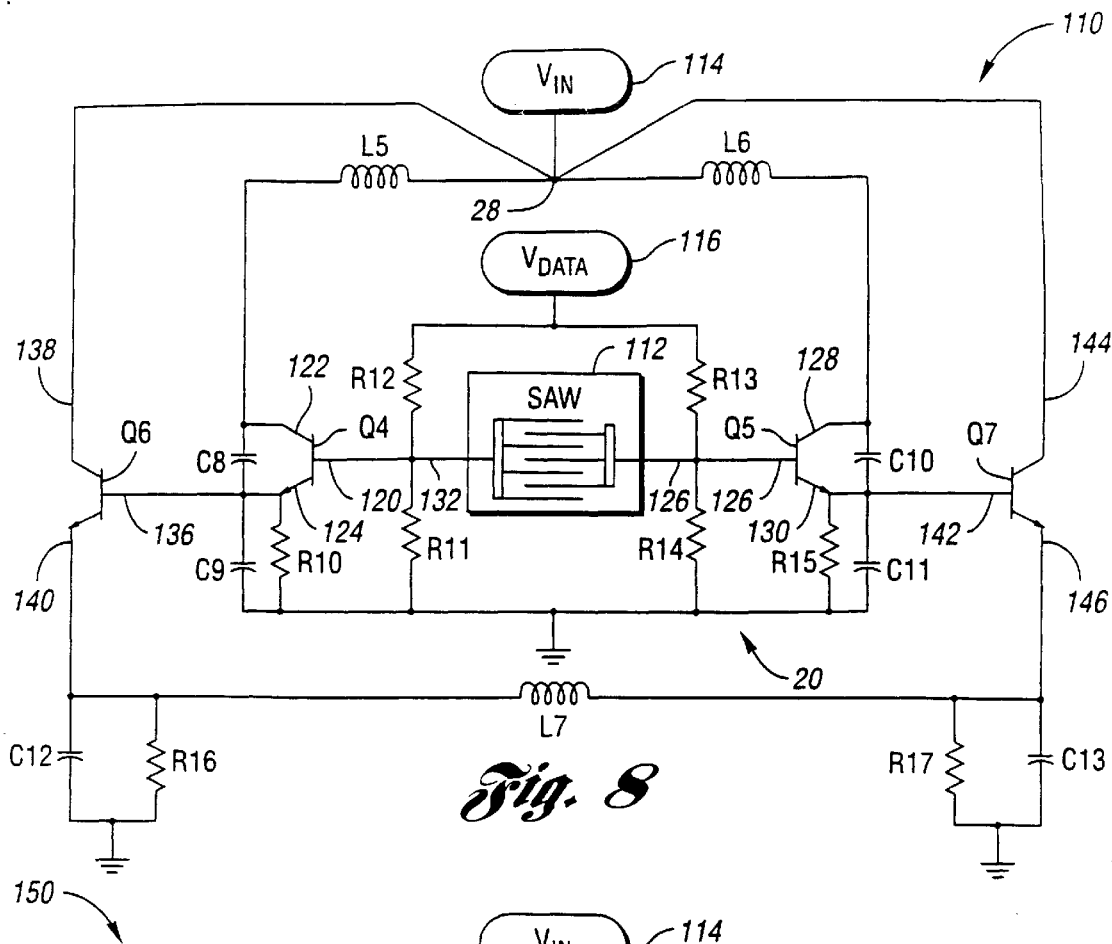
FIG. 8 illustrates a first circuit realization of the system of FIG. 7.

Referring to FIG. 8, a circuit realization 110 of the buffered balanced oscillator and transmitter system of FIG. 7 is illustrated. Buffered balanced oscillator and transmitter circuit 110 comprises a first and second pseudo Colpitts oscillator. Both pseudo Colpitts oscillators are balanced with respect to one another and share a common tank circuit and oscillating current signal I for power output efficiency. Circuit 110 described herein is particularly applicable with automotive remote keyless entry systems. other applications, however, are clearly conceivable to one of ordinary skill in the art.

According to a more detailed description, circuit 110 comprises a balanced oscillator configuration which includes the two pseudo Colpitts oscillator circuits for producing a local oscillation signal. The oscillator circuitry includes a first transistor $Q_4$ and a second transistor $Q_5$ each coupled with a resonator device 112 therebetween. Resonator device 112 acts as a series resonant input tank for generating and stabilizing the oscillating current signal I. By so doing, a resonance RF carrier frequency is achieved.

First and second transistors, $Q_4$ and $Q_5$, each preferably comprise a bipolar junction transistor ("BJT"). Alternatives, however, such as a heterojunction bipolar transistor ("HBT"), should be apparent to one of ordinary skill in the art. According to a further embodiment, transistors $Q_4$ and $Q_5$ are each MMBTH10 type bipolar transistors.

Transistors $Q_4$ and $Q_5$ each operate as an amplification stage to provide a unity loop gain for steady state operations. First transistor $Q_4$ comprises a base, a collector, and emitter 120, 122 and 124, respectively. Likewise, second transistor $Q_5$ comprises a base, a collector, and emitter 126, 128 and 130, respectively. Transistors $Q_4$ and $Q_5$ are each configured as a pseudo Colpitts oscillator having a tuned LC circuitry and positive feedback. It should be understood by one of ordinary skill in the art that various other transistor oscillator configurations may be substituted into the above arrangement to achieve the same functional purpose.

Resonator device 112 is coupled between the base terminals 120 and 126 of transistors $Q_4$ and $Q_5$ via output lines 132 and 134, respectively. Resonator 112 is shown having an array of metallic fingers formed on a piezoelectric substrate.

Resonator 112 advantageously operates to stabilize oscillations of the carrier signal. Resonator device 112 preferably comprises a series resonant input tank circuit surface acoustic wave ("SAW") device. However, according to a further embodiment, SAW resonator 112 is a RO2073 SAW resonator manufactured and sold by RF Monolithics, Incorporated.

Circuit 110 further comprises a pair of output tank circuits, which in combination with transistors $Q_4$ and $Q_5$ form a first and second oscillator. Each output tank circuit includes a capacitor and inductor; first input tank comprises first inductor $L_5$ and second input tank comprises second inductor $L_6$. First inductor $L_5$ is coupled between collector terminal 122 of transistor $Q_2$ and node 118, while second inductor $L_6$ is coupled between collector terminal 128 of transistor $Q_5$ and node 118. Accordingly, inductors $L_5$ and $L_6$ are coupled together at node 118 in a series connection. A voltage input source 114 is coupled to node 118 between inductors $L_5$ and $L_6$ for applying a DC voltage input $V_{IN}$ thereto. According to one example of the present invention, voltage input signal $V_{IN}$ is a +3 volt DC signal. Application of the +3 volts between inductors $L_4$ and $L_5$ biases transistors $Q_4$ and $Q_5$ to realize the necessary gain.

Moreover, circuit 110 comprises a data input 116 coupled to both resonator output lines 132 and 134 though respective resistors $R_{12}$ and $R_{13}$. Data input 116 is adapted to receive an on/off data input signal $V_{DATA}$ which is applied to both sides of SAW resonator 112. Each of the resonator output lines 132 and 134 is also coupled to ground via respective resistors $R_{11}$ and $R_{14}$. The data input signal $V_{DATA}$ encodes the carrier signal with a modulation scheme to provide information on the carrier signal. The preferred modulation format is frequency shift key ("FSK"), though other schemes including pulse width modulation ("PWM") and amplitude modulation ("AM") may be easily substituted by one of ordinary skill in the art. The information provided on the carrier signal may control and/or initiate various system operations, such as a door lock actuation mechanism, as well as the on/off operations of circuit 110. Application of data input signal $V_{DATA}$ may be initiated by manual control through an actuation mechanism such as, for example, a push-button pad, switch or other pulsed activation device.

SAW resonator 112 provides for an input tank circuit which is commonly shared by the pair of balanced oscillators. Inductor $L_5$, in combination with capacitors $C_8$ and $C_9$, furnishes a first output tank circuit. Similarly, inductor $L_6$, in combination with capacitors $C_{10}$ and $C_{11}$, creates a second output tank circuit. While the series resonant input tank stabilizes oscillation of the resonating signal, the output tanks provide for radiation of the RF output signal. Capacitors $C_8$ and $C_9$ also establish a voltage divider network, as well as a positive feedback path to transistor $Q_4$. Likewise, capacitors $C_{10}$ and $C_{11}$ create a voltage divider and a positive feedback path to transistor $Q_5$. Energy is efficiently stored in the capacitors $C_8$ through $C_{11}$, and inductors $L_5$ and $L_6$ to enhance radiation efficacy by the antenna so as to reduce the amount of energy that may otherwise be required for each cycle of transistors $Q_4$ and $Q_5$.

Antenna 100 of FIG. 7 is realized in the present embodiment by inductor $L_7$ for transmitting and radiating an electromagnetic field exhibiting the buffered oscillating signal with the predetermined carrier frequency. Inductor $L_7$, in further embodiments, may additionally comprise two inductors coupled together in series having a center point with a common DC feed, as well as a center point without a common DC feed comprising a resistor juxta positioned between both inductors running to ground.

Circuit 110 also provides means to substantially minimize the effects of parasitic impedances. To realize this aspect of the invention, depicted as first and second buffer, 86 and 88 in FIG. 7, circuit 110 further comprises a third transistor $Q_6$ and a fourth transistor $Q_7$. Third and fourth transistors, $Q_6$ and $Q_7$, both preferably comprise a bipolar junction transistor. Alternatives, however, such as a heterojunction bipolar transistor ("HBT"), are available and should be apparent to one of ordinary skill in the art. According to a further embodiment, transistors $Q_6$ and $Q_7$ are each MMBTH10 type bipolar transistors.

Transistors $Q_6$ and $Q_7$ each operate as a buffer for buffering the first and second oscillating output signals generated by their respective pseudo Colpitts oscillator. Transistors $Q_6$ is coupled with both a first supplemental tank and the output resonant tank associated with transistor $Q_4$, while transistors $Q_7$ is coupled with both a second supplemental resonant tank and the output resonant tank associated with transistor $Q_5$. First and second supplemental resonant tanks, referred to as resonating circuit 93 in FIG. 7, functionally decrease the output impedance of circuit 110. By so doing, the output signal ultimately radiated by the antenna $L_7$ comprises an increased percentage of the first and second output signals.

Transistor $Q_6$ comprises a base, collector and emitter, 136, 138 and 140, respectively, while transistor $Q_7$ comprises a base, collector and emitter, 142, 144 and 146, respectively. The base 136 of transistor $Q_6$ is coupled between capacitors $C_8$ and $C_9$, at the node for which emitter 124 of transistor $Q_4$ also is coupled with resistor $R_{10}$, while collector 138 is coupled with node 118. Further, emitter 140 is coupled with the first supplemental resonant tank. First supplemental resonant tank comprises capacitor $C_{12}$ and resistor $R_{16}$, which are both grounded, as well as a first terminal of inductor $L_7$, which is coupled with the second supplemental resonant tank. Similarly, the base 142 of transistor $Q_7$ is coupled between capacitors $C_{10}$ and $C_{11}$, at the node for which emitter 130 of transistor $Q_5$ also is coupled with resistor $R_{15}$, while collector 144 is coupled with node 118. Further, emitter 146 is coupled with the second supplemental resonant tank. Second supplemental resonant tank comprises capacitor $C_{13}$ and resistor $R_{17}$, which are both grounded, as well as the second terminal inductor $L_7$, which is coupled with the first supplemental resonant tank. It should be understood by one of ordinary skill in the art that various other transistor buffer configurations may be substituted into the above arrangement to achieve the same functional purpose.

Figure 9:
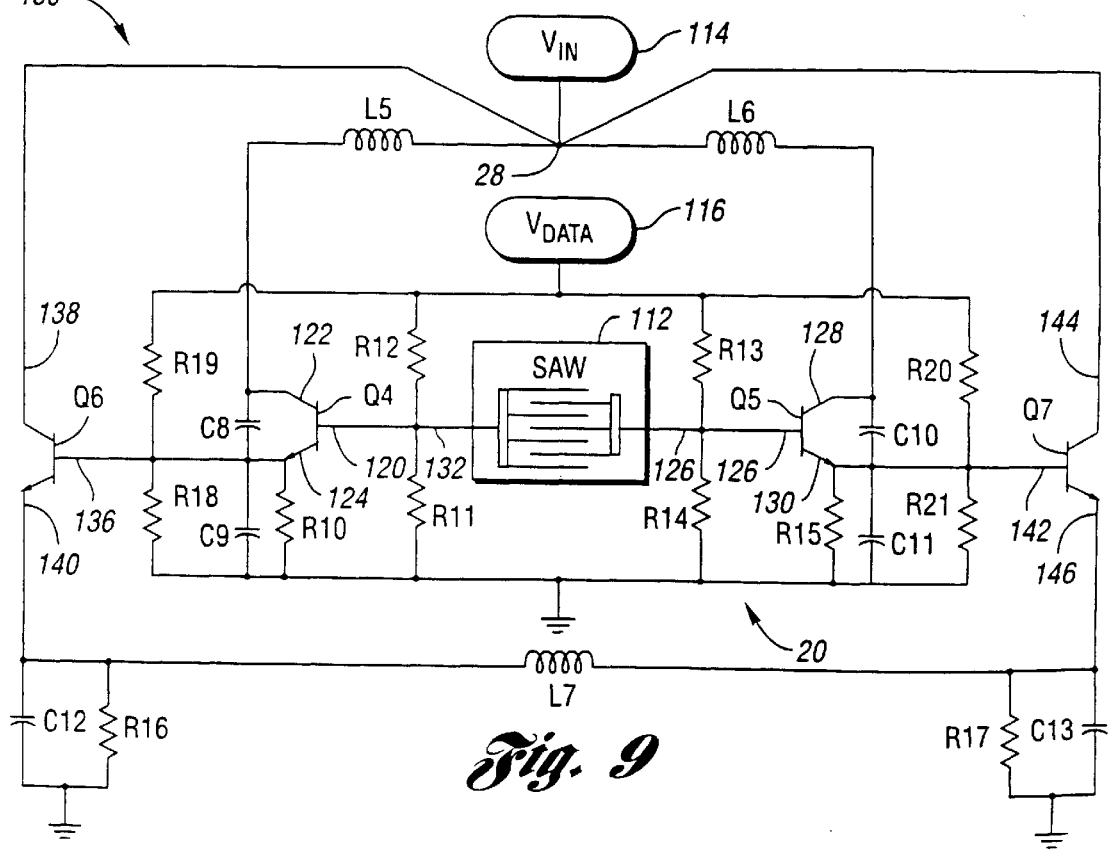
FIG. 9 illustrates a second circuit realization of the system of FIG. 7.

Referring to FIG. 9, a second circuit realization of the buffered balanced oscillator and transmitter system of FIG. 7 is illustrated. Circuit 150 of FIG. 8 may alternately be configured to include a device for increasing the output range of each of the oscillating outputs of the first and second pseudo Colpitts oscillators. This device preferably comprises a first and second voltage divider circuit for first and second pseudo Colpitts oscillators, respectively.

According to a more detailed description, transistors $Q_4$ and $Q_5$ are each coupled with transistors $Q_6$ and $Q_7$, respectively, by means of a first and second modified resonant circuit forming voltage divider circuits. With respect to transistor $Q_4$, collector 122 is coupled with capacitor $C_8$, while emitter 124 is coupled with capacitors $C_9$ and $C_{14}$, as well as resistor $R_{10}$. Moreover, capacitor $C_8$ is coupled with capacitor $C_{14}$ at an input node to transistor $Q_6$. Similarly, collector 128 of transistor $Q_5$ is coupled with capacitor $C_{10}$. Emitter 130 is coupled with capacitors $C_1 1$ and $C_{15}$, and resistor $R_{15}$. Capacitor $C_{10}$ is also coupled with capacitor $C_{15}$ at an input node to transistor $Q_7$. The bases 136 and 142 of transistors $Q_6$ and $Q_7$ are fed by transistors $Q_4$ and $Q_5$ at the point where capacitors $C_8$ and $C_{14}$, as well as $C_{10}$ and $C_{15}$, respectively couple together to generate a greater voltage swing.

Furthermore, a resistor network is provided between $V_{DATA}$ and the modified resonant circuit, detailed herein. With respect to transistor $Q_6$, resistor $R_{19}$ is coupled with the input node of the base 136 of transistor $Q_6$, while resistor $R_{18}$ is coupled from the input node of base 136 to ground. As such, resistor $R_{18}$ is in parallel with capacitors $C_{14}$ and $C_9$. Likewise, resistor $R_{20}$ is coupled with the input node of base 142 of transistor $Q_7$, and resistor $R_{21}$ is coupled from this input node of base 142 to ground such that resistor $R_{21}$ is positioned in parallel with capacitors $C_{15}$ and $C_{11}$. In so doing, the output ranges created across resistors $R_{18}$ and $R_{21}$ are substantially increased. This increase is attributable to the repositioning of bases 136 and 142 with the collector to ground voltages of transistors $Q_4$ and $Q_5$, respectively, and their associated ranges, in view of the added voltage divider. In one embodiment, using certain values for the above capacitor and resistor components, the voltage range is increased by 100 percent.

Figure 10:
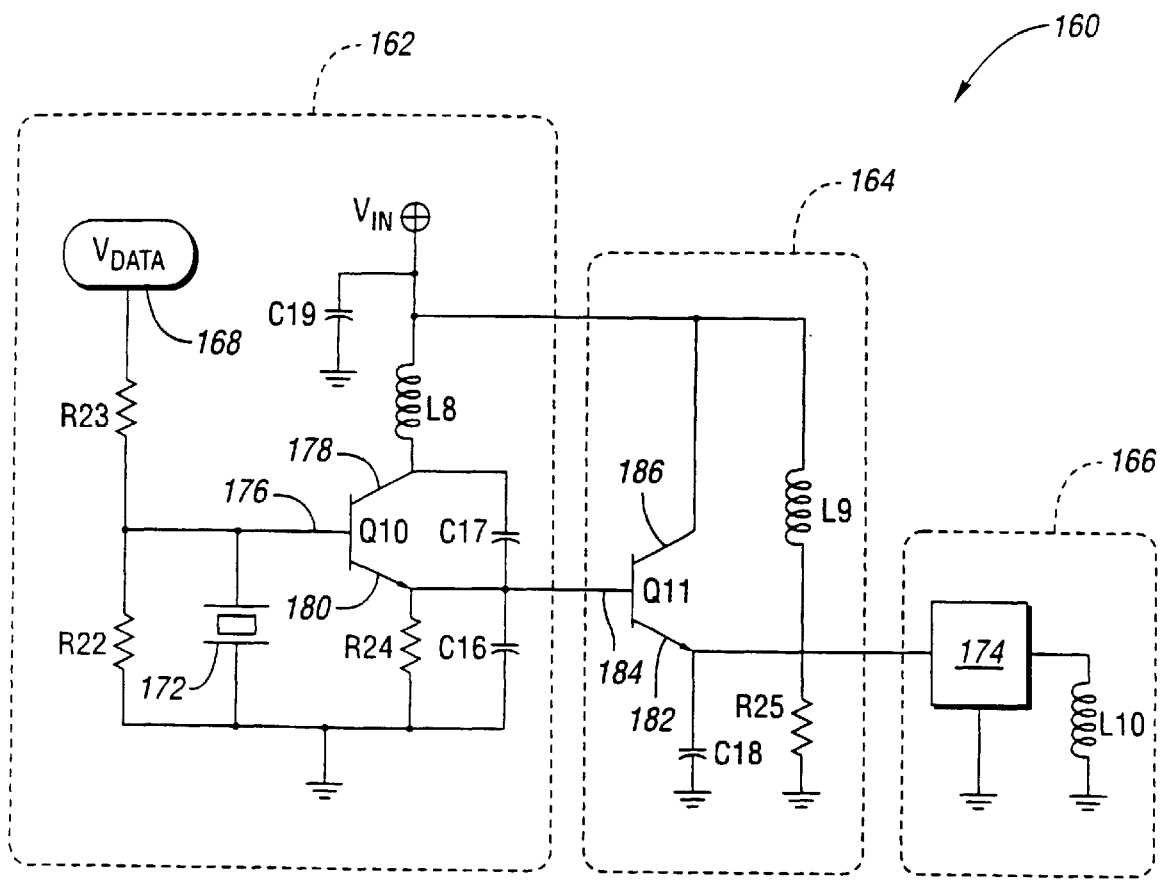
FIG. 10 illustrates a buffered oscillator and transmitter circuit.

Referring to FIG. 10, a further alternate embodiment depicting a buffered oscillator and transmitter circuit 160 is illustrated. Circuit 160 comprises three functional stages: a pseudo Colpitts oscillator 162, a buffer 164 and an output system 166. Circuit 160 described herein is particularly applicable with automotive remote keyless entry systems. Other applications, however, are clearly foreseeable to one of ordinary skill in the art.

According to a more detailed description, oscillator 162 comprises a Colpitts configured transistor $Q_{10}$ and an input resonant tank circuit. The tank circuit typically comprises a resonator, such as a surface acoustic wave ("SAW") device 172, a pair of feedback capacitors, $C_{16}$ and $C_{17}$, an inductor $L_8$, as well as a capacitor $C_{19}$ for providing a large capacitance to maintain a constant DC voltage. Further, the oscillator also includes a number of biasing resistors to facilitate the proper operation of transistor $Q_{10}$. Transistor $Q_{10}$ functionally provides a unity loop gain for steady state operations.

Structurally, transistor $Q_{10}$ comprises a base 176, collector 178 and an emitter 180. Base terminal 176 is coupled with surface acoustic wave resonator 172, and collector 178 is coupled with inductor $L_8$, while emitter 180 is coupled to ground through a resistor $R_{24}$. Additionally, feedback capacitor $C_{16}$ is coupled between emitter 180 and ground, and as such, is in parallel with resistor $R_{24}$, while feedback capacitor $C_{17}$ is coupled between collector 178 and emitter 180. Capacitor $C_{19}$ is coupled between ground and $V_{IN}$.

Transistor. $Q_{10}$ is coupled to a direct current ("DC") voltage source 170 through inductor $L_8$ to receive a DC bias input $V_{IN}$, typically 6V. Oscillator 162 also receives a data input signal $V_{DATA}$ 168 for encoding the RF carrier signal, by means of a resistor network forming a voltage divider circuit. Data input 168 is adapted to receive an on/off data input signal $V_{DATA}$ which is applied to SAW resonator 172. The data input signal $V_{DATA}$ encodes the carrier signal with a modulation scheme to provide information on the carrier signal. The preferred modulation format is frequency shift key ("FSK"), though other schemes including pulse width modulation ("PWM") and amplitude modulation ("AM") may be easily substituted by one of ordinary skill in the art. The information provided on the carrier signal may control and/or initiate various system operations, such as a door lock actuation mechanism, as well as the on/off operations of circuit 160. Application of data input sign $V_{DATA}$ may be initiated by manual control through an actuation mechanism such as, for example, a push-button pad, switch or other pulsed activation device. By this configuration, transistor $Q_{10}$, acting as an amplifier, in combination with the resonating tank circuit, generates a oscillating output signal.

Transistors, $Q_{10}$ and $Q_{11}$, each preferably comprise a bipolar junction transistor ("BJT"). Alternatives, however, such as a heterojunction bipolar transistor ("HBT"), should be apparent to one of ordinary skill in the art. According to a further embodiment, transistors $Q_2$ and $Q_3$ are each MMBTH10 type bipolar transistors.

Resonator device 172 is coupled between base 176 of transistor $Q_{10}$ and ground. Resonator 172 advantageously operates to stabilize oscillations of the carrier signal. Resonator device 172 preferably comprises a series resonant input tank circuit surface acoustic wave ("SAW") device. However, according to a further embodiment, SAW resonator 172 is a RO2073 SAW resonator manufactured and sold by RF Monolithics, Incorporated.

Buffer 164 functionally minimizes the effects of parasitic impedances created through various means detailed herein. To realize this benefit, buffer 164 comprises a transistor $Q_{11}$, as well as a buffer resonant tank of inductor $L_9$ and capacitor $C_{18}$. Transistor $Q_{11}$ comprises a base 184, a collector 186 and an emitter 182. Buffer 164 is coupled with oscillator 162 at two nodes. First, buffer 164 receives a DC bias input $V_{IN}$ through direct current ("DC") voltage source 170 at collector 186, wherefrom $L_8$ of oscillator 162 is also biased. Buffer 164 is also coupled with oscillator 162 at emitter 180 of transistor $Q_{10}$ and base 184 of transistor $Q_{11}$.

Output stage 166 is coupled with buffer 164 for the purpose of transmitting the oscillating signal. The output of buffer 164, having an oscillating output at the resonant frequency, is transmitted across to stage 166. Stage 166 additionally comprises a device 174 for matching the output impedance of the circuit. Finally, output stage 166 comprises an antenna in the form of inductor $L_{10}$ for transmitting the resultant oscillating signal.

It should be noted that the oscillator and transmitter circuits of the present invention may be mounted within a compact enclosure and advantageously employed to transmit control signals, especially for use in connection with a remote controlled keyless entry system. For such an application, the user may manually activate the $V_{DATA}$ input to encode the carrier signal with selected information. The carrier signal and modulating information are then radiated from the transmitter circuits by means of the output tanks. A receiver which is generally mounted within a vehicle will receive the radiating signal, decode the modulating information and initiate and/or execute the selected operation such as locking or unlocking a vehicle door, activating or deactivating an -alarm system, for example. In contrast to conventional approaches, these circuits advantageously achieve increased output power and maintain an efficient power usage therewith.

Furthermore, it should also be apparent that the embodiments of the present invention may use various sized components which may be modified without departing from the invention. As one example, inductors $L_8$ and $L_9$ each provide an inductance of approximately 40 nH. Capacitors $C_{17}$ and $C_{18}$ each may have a capacitance of approximately 4.7 pF, while capacitor $C_{16}$ has a capacitance of about 22 pF. Resistor $R_{23}$ may have a resistance of about 15 kΩ. Resistor $R_{24}$ may have a resistance of about 6.8 kΩ, while resistor $R_{24}$ has a resistance of about 180 Ω.

Figure 11:
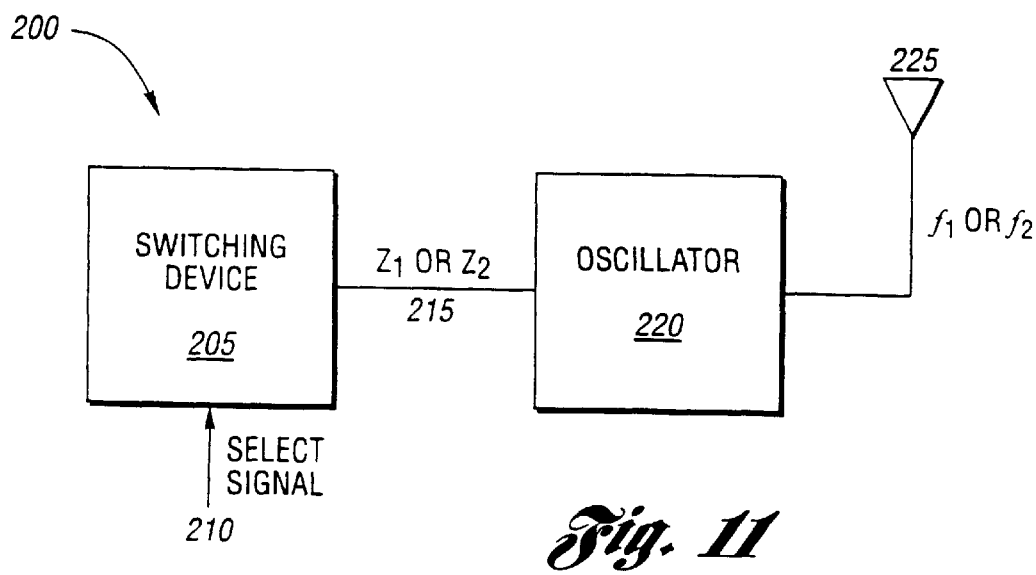
FIG. 11 illustrates a block diagram of a system for selectably oscillating at a first or second frequency.

Referring to FIG. 11, a block diagram of a system 200 for selectably oscillating at a first or second frequency is illustrated. System 200 comprises an oscillator 220 for generating an oscillating output at $f_1$, or $f_2$, and an antenna 225 for transmitting the oscillating output. Oscillator 220 generally comprises a resonator (not shown), such as a SAW of BAW, for generating a reference signal, and amplifier (not shown) for amplifying the reference signal, and a resonating circuit (not shown), including an inductor and capacitor, for generating the oscillating output in response to the amplifier amplifying the reference signal. In one embodiment of the present invention, oscillator 220 is a Colpitts oscillating circuit. In a further embodiment of the present invention, oscillator 220 comprises a balanced oscillator configuration.

Moreover, system 200 comprises a switching device 205. Switching device 205 provides oscillator 220 with a first $(Z_1)$ or second $(Z_2)$ impedance 215, in response to select signal 210. As a result of this configuration, the oscillator output of system 200 oscillates at a first frequency $f_1$, when the first $(z_1)$ impedance is provided to oscillator 220, while the oscillator output of system 200 oscillates at a second frequency $f_2$ when the second $(Z_2)$ impedance is provided to oscillator 220.

Switching device 205 switches between first $(Z_1)$ and second $(Z_2)$ impedances 215 by the voltage level of select signal 210. As such, when select signal 210 is at a first voltage level, first impedance ($Z_1$) is enabled, while second impedance ($Z_2$) is enabled when select signal 210 is at a second voltage level. Furthermore, unlike the known art, each of the first ($Z_1$) and second ($Z_2$) impedances 215 have fixed impedance values independent of the voltage level of select signal 210. Thus, the present invention provides for a first and second impedance both of which are not prone to drifting.

In the preferred embodiment of the present invention, switching device 205 comprises a bipolar junction transistor. As a result, switching device 205 switches between a saturation mode of operation and an off mode of operation in response to select signal 210. To eliminate unwanted reflections created while the transistor falls within an active mode of operation during a transition between saturation mode and off mode, a filter (not shown) is also incorporated.

Figure 12:
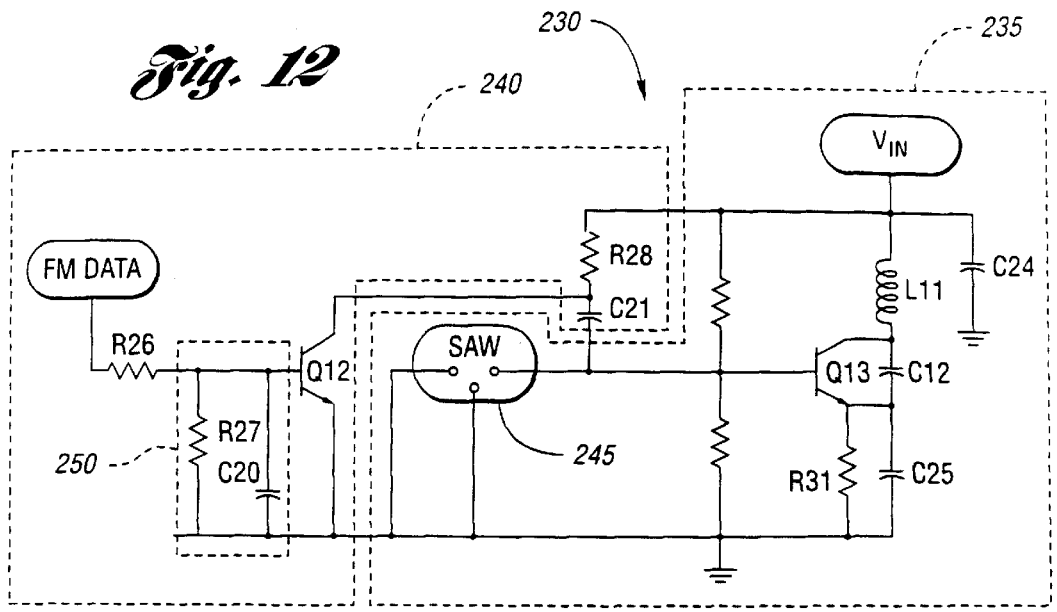
FIG. 12 illustrates a first circuit realization of the system of FIG. 11.

Referring to FIG. 12, a first circuit realization 230 of the system 200 of FIG. 11 is depicted. First circuit realization 230 comprises an oscillator 235 and a modulator 240. Oscillator 235 comprises a Colpitts oscillator. It should be apparent to one of ordinary skill in the art, however, that oscillator 235 may be realized by other oscillator configurations.

Colpitts oscillator 235 comprises a transistor $Q_{13}$ and an input resonant tank circuit. The tank circuit typically comprises a resonator, such as a surface acoustic wave ("SAW") device 245, and a pair of feedback capacitors, $C_{22}$ and $C_{23}$. Further, oscillator 235 also includes a number of biasing resistors to facilitate the proper operation of transistor $Q_{13}$. First circuit realization 230 additionally comprises an inductor $L_{11}$, which acts as an antenna element for radiating the resultant oscillating output signal.

Structurally, transistor $Q_{13}$ comprises a base, collector and emitter. The base terminal is coupled with surface acoustic wave resonator 245, and the collector is coupled with inductor $L_{11}$, while the emitter is coupled to ground through a resistor $R_{31}$. Additionally, feedback capacitor $C_{23}$ is coupled between the emitter and ground, and as such, is in parallel with resistor $R_{31}$. Feedback capacitor $C_{22}$ is coupled between the collector and the emitter. Moreover, a third capacitor $C_{24}$ is coupled between inductor $L_{11}$ and ground for providing a large capacitance to maintain a constant DC voltage.

First circuit realization 230, and more particularly $L_{11}$, and $C_{24}$, is coupled to a direct current ("DC") voltage source to receive a DC bias input $V_{IN}$, typically 6V. Circuit 230 also receives a data input signal $V_{FM\ DATA}$ by way of a switching device or modulator 240, for encoding the RF carrier signal. As detailed hereinabove, circuit 230 generates a radiating output signal via inductor $L_{11}$. In doing so, transistor $Q_{13}$, acting as an amplifier, in combination with the resonating tank circuit, generates a resonating signal which is provided to inductor $L_{11}$ as an oscillating current signal. The conduction of oscillating current signal through inductor $L_{11}$, in turn causes the radiating output signal to be transmitted as an electromagnetic field.

Modulator 240 provides a first or second impedance responsive to data input voltage signal $V_{FM\ DATA}$. Each of the first and second impedances are fixed and independent of the voltage level of the data input voltage signal $V_{FM\ DATA}$ such that the oscillating current output passing through inductor $L_{11}$, has a first oscillating frequency when the first impedance is enabled, and a second oscillating frequency when the second impedance is enabled.

Modulator 240 is realized by a transistor circuit comprising a transistor $Q_{12}$. Transistor $Q_{12}$ is preferably realized by means of a bipolar junction transistor ("BJT"), though a field effect transistor ("FET") may utilized as well. Transistor $Q_{12}$ comprises a base coupled with the data input voltage signal $V_{FM\ DATA}$ through an input resistor $R_{26}$, a collector coupled between a resistor $R_{28}$ and capacitor $C_{21}$ node, and an emitter coupled to ground. The resistor $R_{28}$ and capacitor $C_{21}$ node provides a fixed impedance from the collector of transistor $Q_{12}$. By this configuration, modulator 240 shifts between the fixed impedance alone while transistor $Q_{12}$ is in the off mode of operation, and the fixed impedance in combination with the impedance created as a result of transistor $Q_{12}$ being in a saturation mode of operation.

Modulator 240 additionally comprises a filter 250. Filter 250 is incorporated to remove unwanted reflections created while transistor $Q_{12}$ functions in an active mode of operation. Filter 250 comprises a resistor $R_{27}$ and a capacitor $C_{20}$ coupled to ground. Depending on the voltage level of data input voltage signal $V_{FM\ DATA}$, transistor $Q_{12}$ functions either in the off or saturation mode. However, a change in the voltage level of the data input voltage signal $V_{FM\ DATA}$ from high to low or low to high causes transistor $Q_{12}$ to migrate from off to saturation mode or vice versa. During this transition, for a period of time, transistor $Q_{12}$ begins functioning in the linear, active mode of operation. This results in potentially damaging reflections through circuit 230, which, by incorporating filter 250, are simply minimized.

Figure 13:
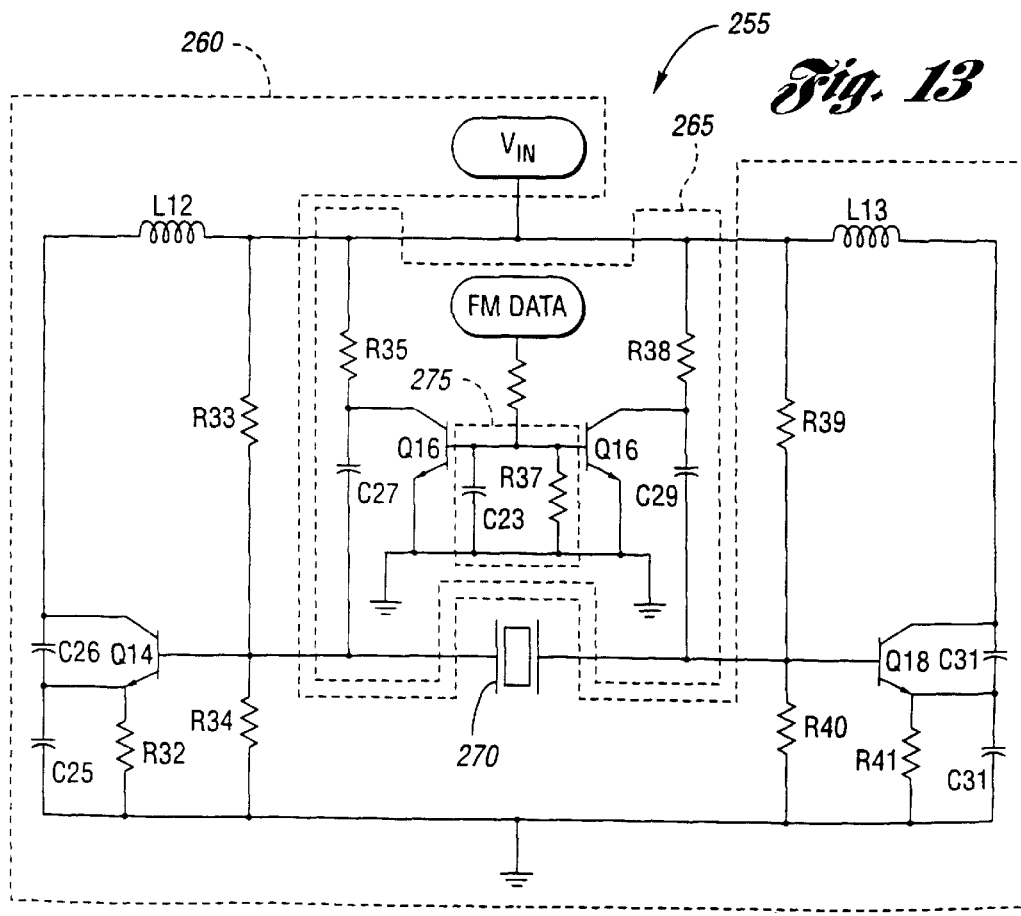
FIG. 13 illustrates the preferred circuit realization of the system of FIG. 11.

Referring to FIG. 13, the preferred circuit realization 255 of the system 200 of FIG. 11 is illustrated. Here, circuit 255 comprises a balanced oscillator 260 and a modulator 265. Balanced oscillator 260 comprises a first and second pseudo Colpitts oscillator. Both pseudo Colpitts oscillators are balanced with respect to one another and share a common tank circuit and oscillating current signal for power output efficiency.

According to a more detailed description, balanced oscillator 260 includes two pseudo Colpitts oscillator circuits for producing a local oscillation signal. The oscillator circuitry includes a first transistor $Q_{14}$ and a second transistor $Q_{18}$ each coupled with a resonator device 270 therebetween. Resonator device 270 acts as a series resonant input tank for generating and stabilizing the oscillating current signal driving inductors $L_{12}$ and $L_{13}$. By so doing, a resonance RF carrier frequency is achieved.

First and second transistors, $Q_{14}$ and $Q_{18}$, each preferably comprise a bipolar junction transistor ("BJT"). Alternatives, however, such as a heterojunction bipolar transistor ("HBT"), should be apparent to one of ordinary skill in the art. According to a further embodiment, transistors $Q_{14}$ and $Q_{18}$ are each MMBTH10 type bipolar transistors.

Transistors $Q_{14}$ and $Q_{18}$ each operate as an amplification stage to provide a unity loop gain for steady state operations. Both transistors $Q_{14}$ and $Q_{18}$ comprise a base, a collector, and emitter and are configured as a pseudo Colpitts oscillator having a tuned LC circuitry and positive feedback. It should be understood by one of ordinary skill in the art that various other transistor oscillator configurations may be substituted into the above arrangement to achieve the same functional purpose.

Resonator device 270 is coupled between the base of transistors $Q_{14}$ and $Q_{18}$. Further, resistors $R_{34}$ and $R_{40}$, respectively, incorporated at the node between the base of each transistor $Q_{14}$ and $Q_{18}$ and resonator 270, and run to ground, to further facilitate the operation of transistors $Q_{14}$ and $Q_{18}$, respectively. Resonator 270 advantageously operates to stabilize oscillations of the carrier signal. Resonator device 270 preferably comprises a series resonant input tank circuit surface acoustic wave ("SAW") device. However, according to a further embodiment, resonator 270 is a RO2073 SAW resonator manufactured and sold by RF Monolithics, Incorporated.

Circuit 255 further comprises a pair of output tank circuits. Each output tank circuit includes a capacitor and inductor; first input tank comprises first inductor $L_{12}$ and second input tank comprises second inductor $L_{13}$. Inductors $L_{12}$ and $L_{13}$ each operate as antenna radiating elements for radiating an output signal in response to the oscillating current signal passing through both. First inductor $L_{12}$ is coupled between the collector of transistor $Q_{14}$ and a node that comprises a resistor $R_{33}$, a first modulator resistor $R_{38}$, and voltage input signal $V_{IN}$. Similarly, second inductor $L_{13}$ is coupled between the collector of transistor $Q_{18}$ and the same node that also comprises a resistor $R_{39}$, a second modulator resistor $R_{35}$, and voltage input signal $V_{IN}$. Accordingly, inductors $L_{12}$ and $L_{13}$ are coupled together at the this node in a series connection.

A voltage input source is coupled to the node for applying the DC voltage input $V_{IN}$ thereto. In one example of the present invention, voltage input signal $V_{IN}$ is a +3 volt DC signal. Application of the +3 volts between inductors $L_{12}$ and $L_{13}$ biases transistors $Q_{14}$ and $Q_{18}$ to realize the necessary gain. Inductors $L_{12}$ and $L_{13}$ each operate as an antenna for transmitting and radiating an electromagnetic field exhibiting the oscillating signal with the predetermined carrier frequency.

Modulator 265 functionally provides a first or second impedance in response to an FM data input. To this end, modulator comprises a FM data input coupled to both the output lines of resonator 270 through an input resistor $R_{36}$ and a mirrored transistor circuit. FM data input is adapted to receive an on/off data input signal $V_{FM\ DATA}$ which is applied to both sides of SAW resonator 270 through the mirrored transistor circuit. The FM data input signal $V_{FM\ DATA}$ encodes the carrier signal with a modulation scheme to provide information on the carrier signal. The preferred modulation format is frequency shift key ("FSK"), though other schemes including pulse width modulation ("PWM") may be easily substituted by one of ordinary skill in the art.

The mirrored transistor circuit of modulator 265 comprises a pair of transistors $Q_{15}$ and $Q_{16}$. The base of each of transistors $Q_{15}$ and $Q_{16}$ are interconnected at the node coupling the FM data input resistor $R_{36}$ and a filter 275. To shift between a first and second impedance in response to the voltage level of $V_{FM\ DATA}$, modulator comprises a pair of resistor-capacitor branches. The first leg of each branch of the pair comprises a resistor, $R_{35}$ and $R_{39}$, respectively, which are coupled between the node attaching the voltage input signal $V_{IN}$, inductors $L_{12}$ and $L_{13}$, and resistors $R_{33}$ and $R_{39}$. The second leg of each branch comprises a capacitor, $C_{27}$ and $C_{29}$, which are coupled to the outputs of resonator 270. Between each of the legs of each of the branches is a collector node where each collector of a respective transistor, $Q_{15}$ and $Q_{16}$, is coupled. The emitter of each transistor, $Q_{15}$ and $Q_{16}$, is further coupled to ground.

Filter 275 is incorporated to remove unwanted reflections created while transistors $Q_{15}$ and $Q_{16}$ function in an active mode of operation. Filter 275 comprises a resistor $R_{37}$ and a capacitor $C_{28}$ coupled to ground. Depending on the voltage level of the data input voltage signal $V_{FM\ DATA}$, transistors $Q_{15}$ and $Q_{16}$ function either in the off or saturation mode. However, a change in the voltage level of the data input voltage signal $V_{FM\ DATA}$ from high to low or low to high causes transistors $Q_{15}$ and $Q_{16}$ to migrate from off to saturation mode or vice versa. During this transition, for a period of time, transistors $Q_{15}$ and $Q_{16}$ begin functioning in the linear, active mode of operation. This results in potentially damaging reflections through circuit 255, which, by incorporating filter 275, are simply minimized.

SAW resonator 270 provides for an input tank circuit which is commonly shared by the pair of pseudo Colpitts. Inductor $L_{12}$, in combination with capacitors $C_{25}$ and $C_{26}$, furnishes a first output tank circuit. Similarly, inductor $L_{13}$, in combination with capacitors $C_{30}$ and $C_{31}$, creates a second output tank circuit. While the series resonant input tank stabilizes oscillation of the resonating signal, the output tanks provide for radiation of the RF output signal. Capacitors $C_{25}$ and $C_{26}$ also establish a voltage divider network, as well as a positive feedback path to transistor $Q_{14}$. Likewise, capacitors $C_{30}$ and $C_{31}$ create a voltage divider and a positive feedback path to transistor $Q_{18}$. Energy is efficiently stored in the capacitors $C_{25}$, $C_{26}$, $C_{30}$, $C_{31}$, and inductors $L_{12}$ and $L_{13}$ to enhance radiation efficacy by reducing the amount of energy that may otherwise be required for each cycle of transistors $Q_{14}$ and $Q_{18}$.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A system for selectably oscillating at a first or a second oscillating frequency, the system comprising:

an oscillator for providing an oscillating output; and a switching device for selecting a first or a second impedance in response to a select signal having a voltage, each of said impedances being fixed independently of the select signal voltage, said oscillating output oscillating at the first oscillating frequency if said first impedance is provided and oscillating at the second oscillating frequency if said second impedance is provided, wherein said switching device comprises a transistor driven into a saturation mode if said select signal is at a first voltage and driven into an off mode if said select signal is at a second voltage, and a filter for removing unwanted reflections generated when said transistor is driven into an active mode of operation.

2. The system of claim 1, wherein said oscillator comprises:

a resonator for generating a reference signal;

an amplifier for amplifying said reference signal; and a resonating circuit for generating said oscillating output in response to said amplifier amplifying said reference signal.

3. The system of claim 2, wherein said resonator comprises a surface acoustic wave ("SAW") device.

4. The system of claim 2, wherein said resonating circuit comprises an inductor and a capacitor.

5. The system of claim 1, further comprising an antenna for transmitting said oscillating output.

6. The system of claim 1, wherein said oscillator is a balanced Colpitts oscillator.

7. A system for selectably oscillating at a first or a second oscillating frequency, the system comprising:
  an oscillator comprising:
    a resonator for generating a reference signal;
    an amplifier for amplifying said reference signal; and
    a resonating circuit for generating an oscillating output in response to said amplifier amplifying said reference signal; and
  a modulator for providing a first or a second impedance responsive to a select signal having a voltage, the value of each of said impedances being fixed independently of the select signal voltage, said oscillating output oscillating at the first oscillating frequency if said modulator comprises said first impedance and oscillating at the second oscillating frequency if said modulator comprises said second impedance, wherein said modulator comprises a transistor driven into a saturation mode if said select signal is at a first voltage and driven into an off mode if said select signal is at a second voltage, and a filter for removing unwanted reflections generated when said transistor is driven into an active mode of operation.

8. The system of claim 7, further comprising an antenna for transmitting said oscillating output.

9. The system of claim 7, wherein said modulator employs at least one of frequency shift key ("FSK") modulation and frequency modulation ("FM").

10. The system of claim 7, wherein said first impedance comprises a capacitance of approximately 6 pF and a resistance of approximately 100 Ω.

11. The system of claim 7, wherein said second impedance comprises a capacitance of approximately 10 pF and a resistance of approximately 10,000 Ω.

12. The system of claim 7, wherein said resonator comprises a surface acoustic wave ("SAW") device.

13. The system of claim 7, wherein said resonating circuit comprises a capacitor and an inductor.

14. The system of claim 7, wherein said amplifier comprises at least one of a bipolar junction transistor and a field effect transistor.

15. The system of claim 7, wherein said oscillator comprises a balanced Colpitts oscillating circuit.

* * * * *